(12) United States Patent
Ries

(10) Patent No.: US 6,497,403 B2
(45) Date of Patent: Dec. 24, 2002

(54) SEMICONDUCTOR WAFER HOLDER

(75) Inventor: Michael J. Ries, St. Charles, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/751,897

(22) Filed: Dec. 28, 2000

(65) Prior Publication Data

US 2002/0084566 A1 Jul. 4, 2002

(51) Int. Cl.[7] .............................................. B25B 1/24
(52) U.S. Cl. ........................ 269/266; 269/296; 269/20
(58) Field of Search ........................ 269/266, 289 R, 269/315, 303, 309, 310, 900, 903, 290, 291, 317, 53, 54.4

(56) References Cited

U.S. PATENT DOCUMENTS

| | | | |
|---|---|---|---|
| 4,684,113 A | * | 8/1987 | Douglas ...................... 269/21 |
| 5,067,695 A | * | 11/1991 | Huddleston ................. 269/21 |
| 5,316,472 A | | 5/1994 | Niino et al. |
| 5,482,559 A | | 1/1996 | Imai et al. |
| 5,492,229 A | | 2/1996 | Tanaka et al. |
| 5,492,566 A | | 2/1996 | Sumnitsch |
| 5,718,574 A | | 2/1998 | Shimazu |
| 5,820,685 A | | 10/1998 | Kurihara et al. |
| 5,834,737 A | | 11/1998 | Hirose et al. |
| 5,848,670 A | | 12/1998 | Salzman |
| 5,897,108 A | * | 4/1999 | Gordon ...................... 269/50 |
| 5,967,578 A | | 10/1999 | Frey |
| 5,984,293 A | * | 11/1999 | Abrahamson ............... 269/266 |
| 6,056,825 A | | 5/2000 | Sumnitsch |
| 6,062,852 A | | 5/2000 | Kawamoto et al. |
| 6,099,302 A | | 8/2000 | Hong et al. |
| 6,158,727 A | * | 12/2000 | Fox ............................ 269/20 |

* cited by examiner

Primary Examiner—Joseph J. Hail, III
Assistant Examiner—Daniel Shanley
(74) Attorney, Agent, or Firm—Senniger, Powers, Leavitt & Roedel

(57) ABSTRACT

A holder for holding a semiconductor wafer for treatment in wafer treating apparatus including a plurality of supports for generally point support of the wafer at a plurality of points on the wafer. Each support bears a fraction of weight of the wafer and is movable up and down and subject to force biasing it to move upward. The total of the forces exerted on the supports biasing them upward is adapted to counterbalance the weight of the wafer.

26 Claims, 6 Drawing Sheets

SEMICONDUCTOR WAFER HOLDER

BACKGROUND OF THE INVENTION

The present invention relates generally to semiconductor wafer treating apparatus such as thermal processing machines, and more particularly to pin-type wafer holders used to support semiconductor wafers during treatment in wafer treating apparatus.

Prior art pin-type holders comprise three pins, each of which has an upper end for supporting a bottom surface of the wafer. Three pins are conventionally used since the three upper ends constitute three points which define a plane. Using more than three pins to hold the wafer is more difficult since it is difficult to align more than three points (i.e., points defined by upper ends of the pins) in the same plane. Moreover, the bottom surface of the wafer may not be perfectly planar, so that even if the pins are aligned, they may not all contact the wafer.

A typical use of a wafer holder is to support the wafer in a thermal processing machine. The wafer deforms during thermal processing such that portions of the bottom surface of the wafer are forced against the pins. Such motion creates damage on the bottom surface of the wafer and results in dislocations which may propagate through the wafer and negatively affect the front surface of the wafer. Such damage is increased as the weight of the wafer is increased. In conventional three-pin holders, each pin must support one third of the weight of the wafer. Wafer consumers now demand larger diameter wafers which are heavier, and the damage caused by the three pin holders is thereby worsened.

Another type of holder uses a combination of fixed pins and spring biased pins, as shown in U.S. Pat. No. 5,718,574. However, such an arrangement is not desirable since the wafer will be damaged by the fixed pins, and because the weight of the wafer may not be evenly distributed among the pins.

SUMMARY OF THE INVENTION

Among the several objects and features of the present invention may be noted the provision of a semiconductor wafer holder which inhibits damage and dislocations in the wafer, the provision of such a holder which decreases the number of wafers damaged during thermal processing, and the provision of such a holder which increases the yield of acceptable wafers.

Briefly, apparatus of this invention is a holder for holding a semiconductor wafer for treatment in wafer treating apparatus including a plurality of supports for generally point support of the wafer at a plurality of points on the wafer. Each support bears a fraction of weight of the wafer and is movable up and down and subject to force biasing it to move upward. The total of the forces exerted on the supports biasing them upward is adapted to counterbalance the weight of the wafer.

In another aspect of the invention, the holder comprises a plurality of wafer rests for the resting of the wafer thereon. Each rest is extensible up and down and comprises a lower elongate member fixed in generally vertically extending position. Each rest further comprises a generally vertically extending cylinder constituting a wafer-holding pin including a lower end slidable up and down on the lower members and an upper closed end having a tapered tip for generally point engagement with a bottom surface of the wafer. The cylinders provide at their upper ends for generally point support of the wafer at a plurality of points distributed around the bottom of the wafer. Each cylinder bears a fraction of the weight of the wafer. The holder further comprises a system for flow of gas under pressure into and out of each cylinder for establishing an upwardly biasing force on each cylinder. The total of the forces exerted on the cylinders biases them upward and is adapted to counterbalance the weight of the wafer.

In yet another aspect of the present invention, the holder comprises a plurality of wafer rests which are extensible up and down. Each rest comprises an upper member having an upper end for resting thereon of the wafer. Each upper member is movable up and down on a fixed lower member. The upper members provide at their upper ends for generally point support of the wafer at a plurality of points. Each upper member bears a fraction of weight of the wafer and is subject to force biasing it to move upward relative to the fixed lower member. The total of the forces exerted on the upper members biasing them upward is adapted to counterbalance the weight of the wafer.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
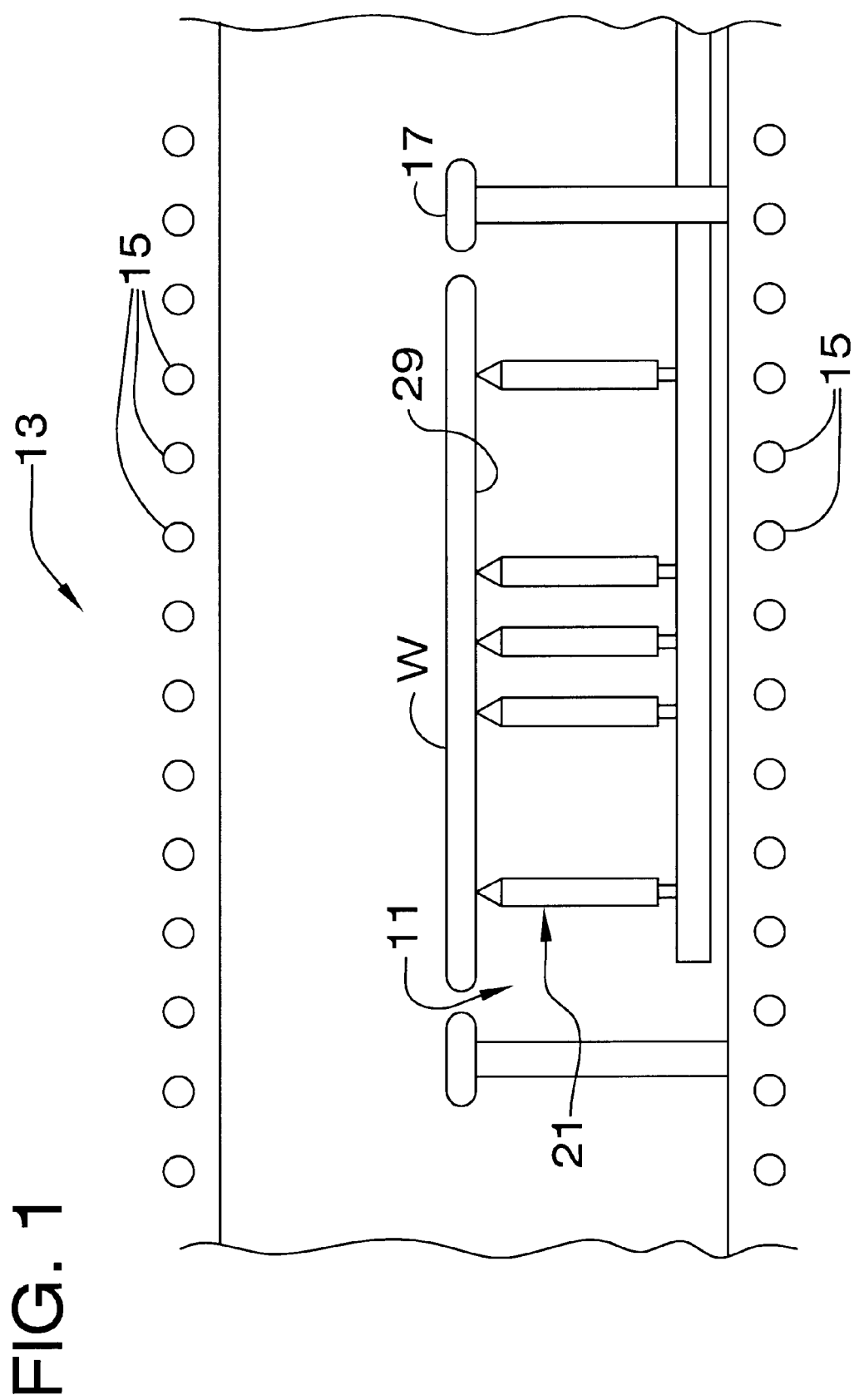
FIG. 1 is a schematic elevational view of a portion of a thermal processing machine including a holder of the present invention.
Figure 2:
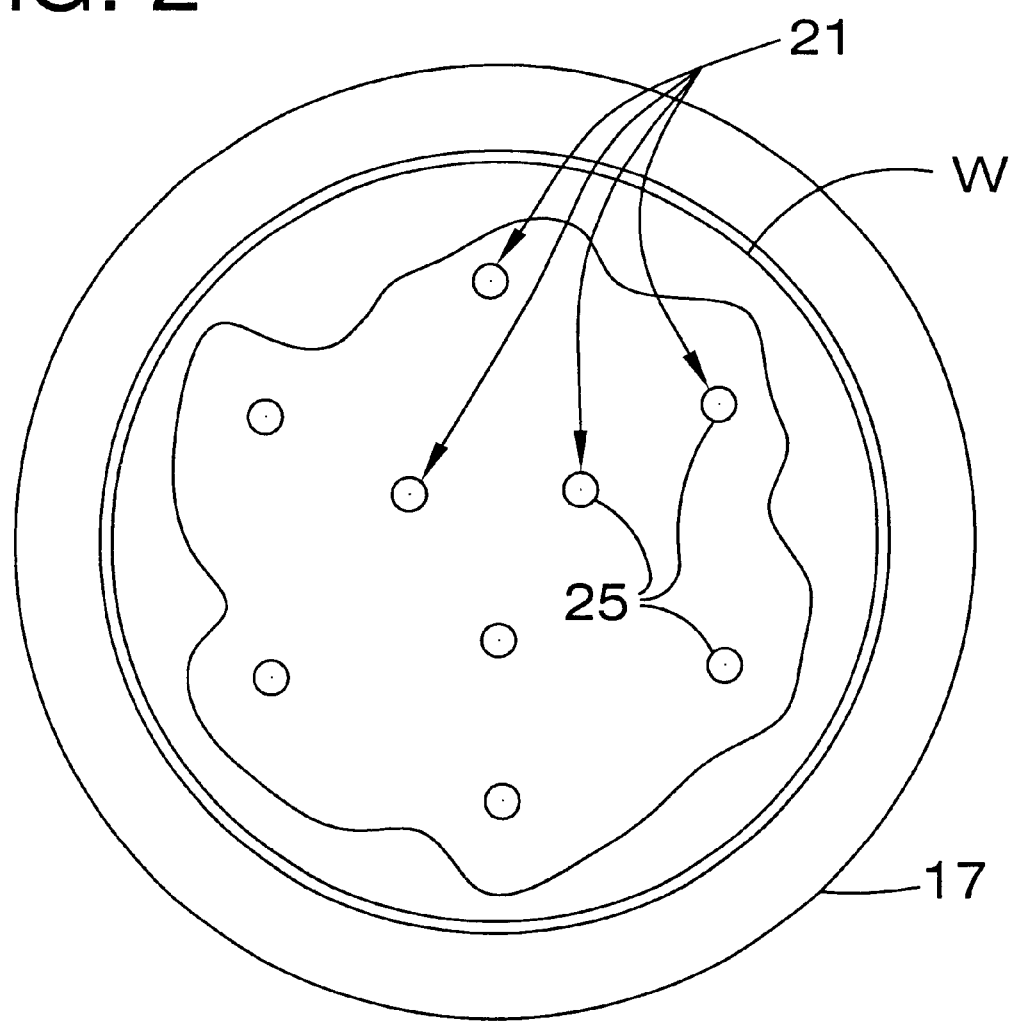
FIG. 2 is a top view of the portion of the thermal processing machine, a portion of a wafer being broken away to show the location of wafer rests of the holder.

Referring now to the drawings and in particular to FIGS. 1 and 2, a holder for holding a semiconductor wafer W is designated in its entirety by the reference numeral 11. The holder is supported in a single-wafer thermal processing machine 13 (generally, wafer treating apparatus) comprising heat sources 15 for thermally treating the wafer W. The machine further includes a conventional slip-guard ring 17 mounted therein to surround the wafer W during processing. The ring 17 helps to ensure uniform temperature throughout the wafer W during processing. The thermal processing machine 13 is suitably a Model AST 3000 available from Steag RTP Systems, GmbH of Dornstadt, Germany, only a portion of which is shown. It is contemplated that the invention be used with any single-wafer or multiple-wafer treating apparatus and its use is not limited to a thermal processing machine.

Referring to FIGS. 1–4, the holder 11 comprises a plurality of rigid wafer rests generally referred to as 21 for supporting of the wafer W thereon. Each rest 21 is movable up and down and comprises a tubular guide 23 (generally, lower elongate member) fixed in generally vertically extending position. Each rest 21 further comprises a generally vertically extending cylinder 25 constituting a wafer-holding pin. Each rest is suitably made of graphite, quartz or other material capable of withstanding extremely high temperatures. The cylinder 25 includes a lower end slidable up and down on the guide 23 and an upper closed end having a tapered, pointed tip 27 for generally point engagement with a bottom surface 29 of the wafer W. Collectively, the pointed tips 27 of the cylinders 25 provide for generally point support of the wafer W at a plurality of points distributed about the bottom of the wafer. As shown in FIG. 2, there are three rests 21 equi-angularly spaced at a first radius from the center of the wafer W, and six more rests also equi-angularly spaced at a second radius from center. The rests 21 are suitably arranged to help ensure that each rest bears an equal fraction of the total weight of the wafer W, though other arrangements are contemplated. The holder 11 is preferably capable of supporting wafers as large as, for example, 300 mm while inhibiting damage of the wafer W during processing. The number of rests will vary, though it is preferred to have at least four.

The cylinder 25 is guided as it moves vertically by the tubular guide. Preferably, there is only a small gap between the cylinder and guide, e.g., a gap on the order of microns. Preferably, the cylinder 25 includes a cylindrical bore 35 (generally, cavity) extending partway up the length of the cylinder. The bore is concentric with the periphery of the cylinder. Each tubular guide 23 extends partway into the bore of the respective cylinder 25. Preferably, each rest is substantially identically constructed.

A system for flow of pressurized gas comprises ducts 39 and the tubular guides connected thereto. A flow of pressurized gas is delivered from a source (not shown) through the ducts 39 and a bore in the tubular guide 23 to the bore 35 of the cylinder. Pressurized gas flows at a predetermined flow rate through the tubular guide 23 and into the bore 35 to move the cylinder 25 upward and thereby establish an upwardly biasing force on the cylinder. Each cylinder 25 is resiliently yieldable downwardly against the upwardly biasing force. The total of the upwardly biasing forces exerted on the cylinders 25 is adapted to counterbalance the weight of the wafer W and the cylinders. Preferably, the flow rate into each cylinder 25 is equal even if the wafer W deforms during treatment.

Figure 3:
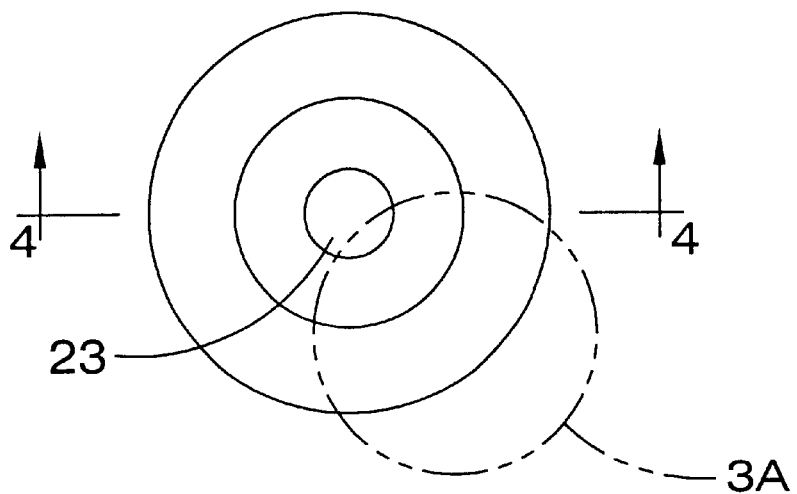
FIG. 3 is a bottom view of a wafer rest of the holder.
Figure 3A:
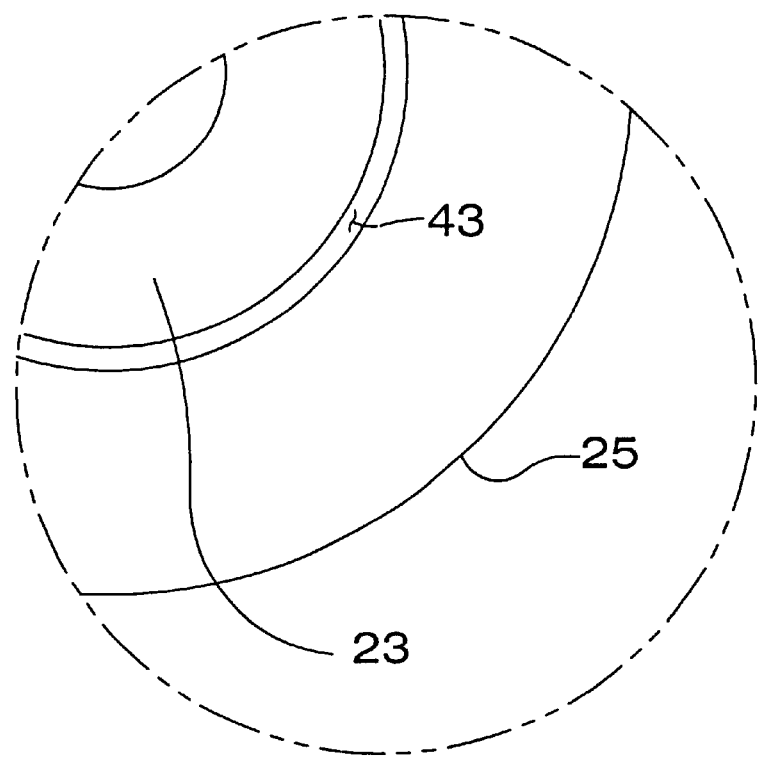
FIG. 3A is an enlarged bottom view of a portion of the wafer rest.
Figure 4:
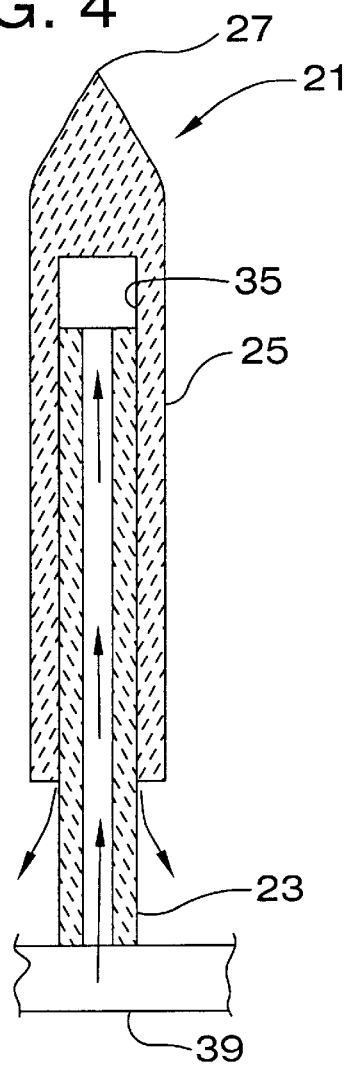
FIG. 4 is a sectional view taken along line 4—4 of FIG. 3.
Figure 5:
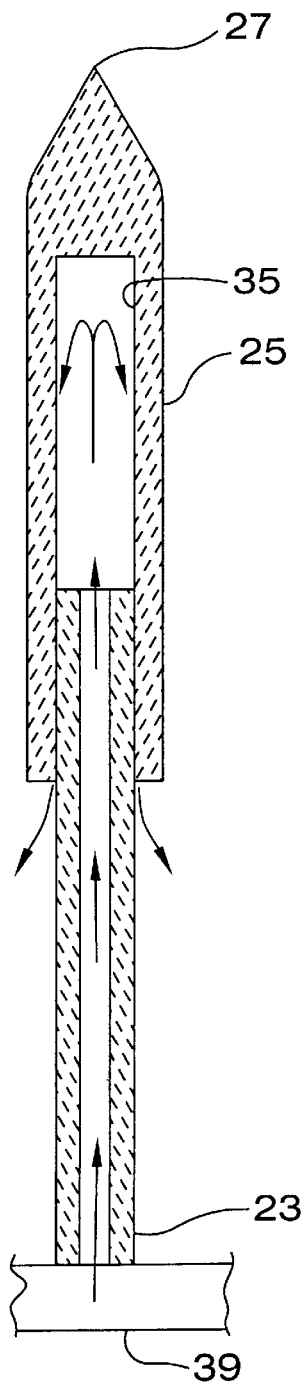
FIG. 5 is a sectional view similar to FIG. 4 except showing the wafer rest in a raised position.

Preferably, an outlet for flow of gas out of each rest is provided at the lower end of each cylinder 25 and is constituted by a mouth of a passage 43 between the cylinder 25 and the tubular guide (FIG. 3A). As mentioned above, the clearance between the cylinder and guide is preferably very small so that the passage is very small. Gas is preferably exhausted into the machine in a direction away from the upper end of the cylinder 25 a substantial distance from the wafer W. The cylinder may be lengthened to further distance its lower exhaust end from the wafer W (FIGS. 4, 5). It is contemplated that outlet passages may be provided in other positions on the rest including in the bore 35. The preferred gas is any suitable non-reactive gas, such as argon or hydrogen.

Figure 7:
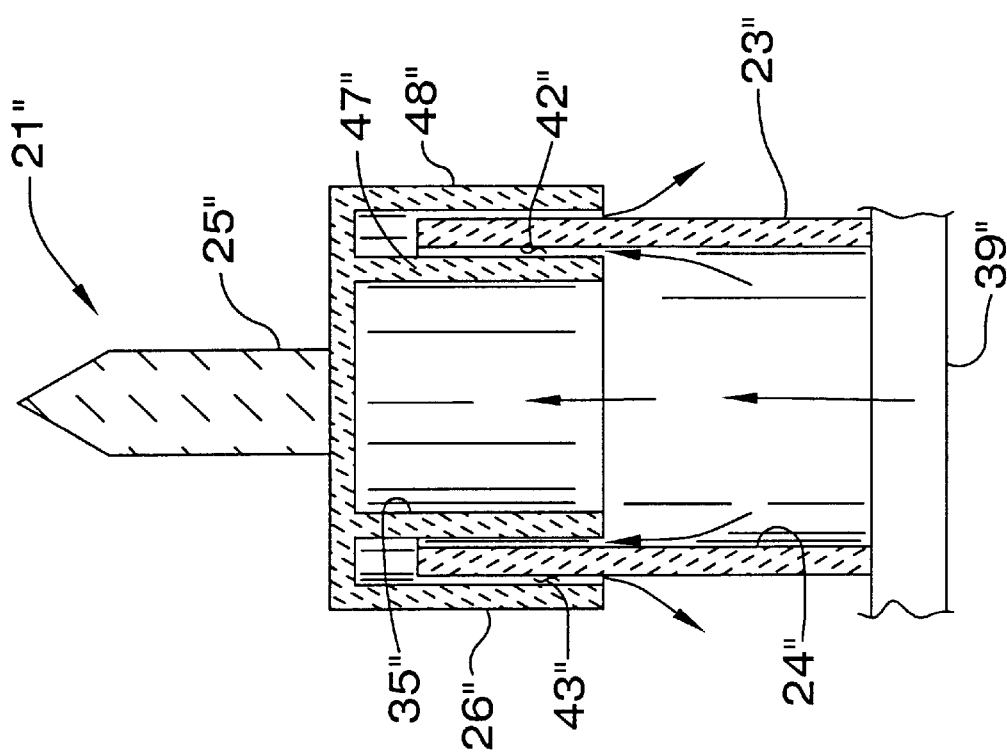
FIG. 7 is a sectional view of a second embodiment of the wafer rest.

In a second embodiment shown in FIG. 7, rest 21' comprises a cylinder 25' having a lower end 26' received in a bore 24' of guide 23'. Gas is introduced from duct 39', enters bore 35' and exits through passage 43' upward toward the wafer. The width of the passage is exaggerated for illustration purposes. The arrangement of the second embodiment directs exhaust gas upward toward the wafer W. As shown, a lower portion of the cylinder has a wider outer diameter than the upper portion of the cylinder. It is contemplated that the upper and lower portions may have the same outer diameter, though such may be undesirable because of the added weight in the upper portion. Adding additional weight to the cylinder generally increases the gas flow required to raise the cylinder.

Figure 8:
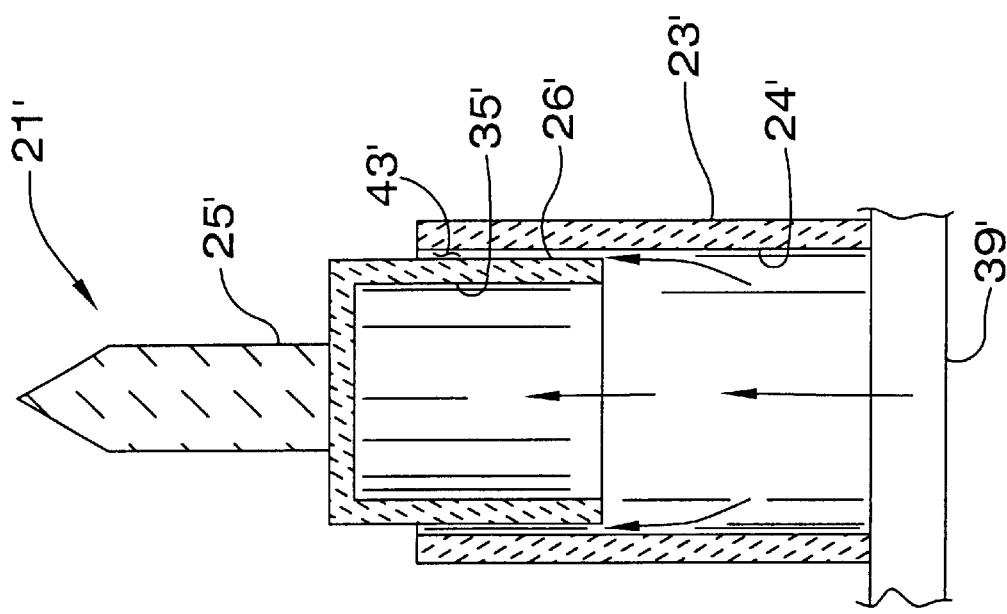
FIG. 8 is a sectional view of a third embodiment of the wafer rest.

In a third embodiment shown in FIG. 8, rest 21" comprises a cylinder 25" having a lower end 26" including an inner cylinder 47" and outer cylinder 48". The inner cylinder 47" is received in a bore 24" of guide 23", while the outer cylinder is positioned outside the bore. Gas is introduced from duct 39", enters bore 35" and exits the bore by first flowing upward through a first passage 42" and then downward through a second passage 43" and is exhausted in a downward as direction away from the wafer W. The width of the passages is exaggerated for illustration purposes.

Figure 6:
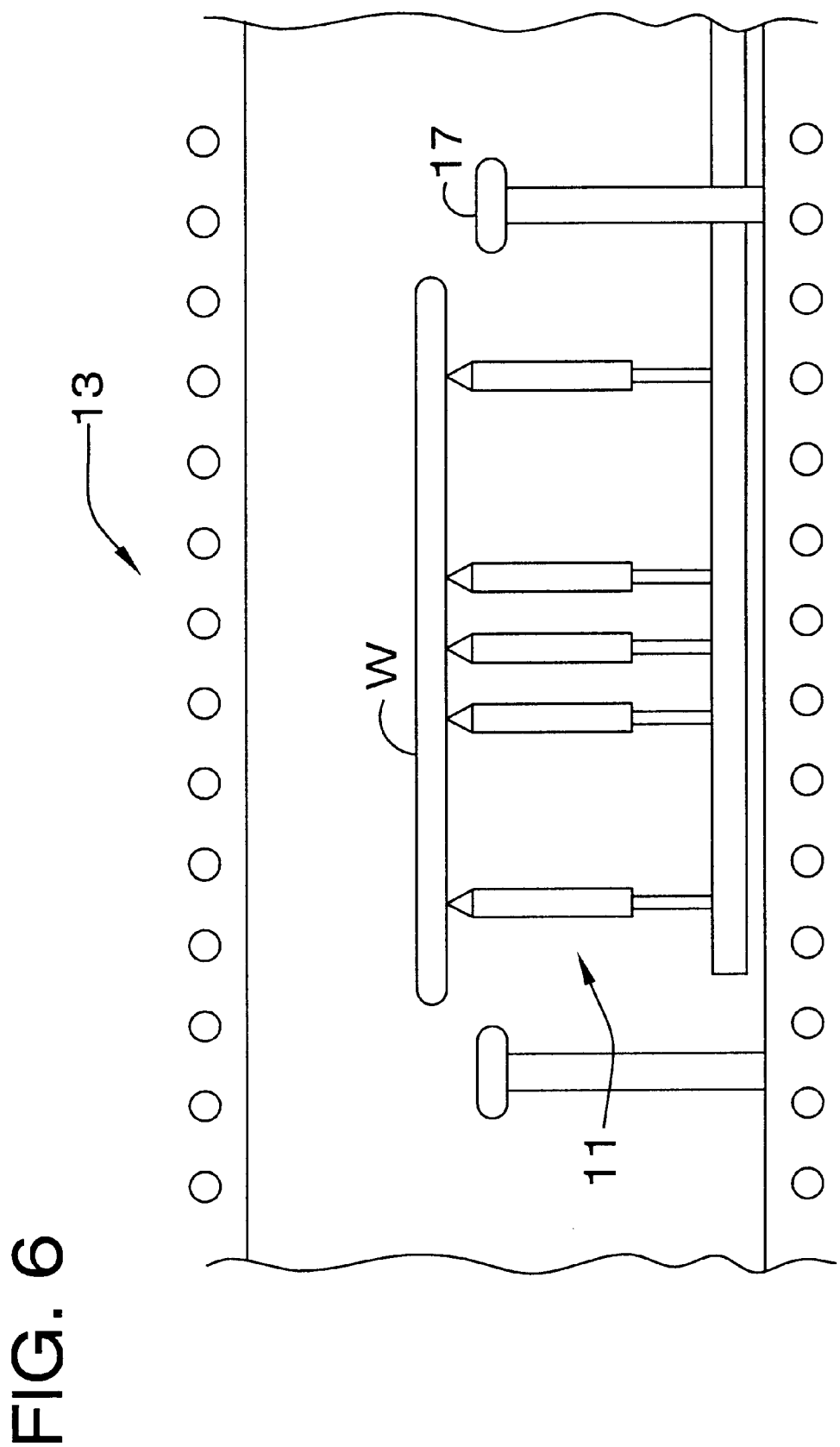
FIG. 6 is an elevational view similar to FIG. 1 except showing the holder and wafer in a raised position.

Referring again to the first embodiment shown in FIGS. 1–6, in a method of the invention, a valve (not shown) is opened to cause pressurized gas to flow into the cylinders 25 and to flow out through passage 43. The flow rate of the gas is increased until the cylinders move up to a raised position, as shown in FIGS. 5 and 6, at which position the flow rate is held steady. Note that the raised position may be varied by increasing or decreasing the flow rate. A wafer W is delivered onto the cylinders 25, preferably by a robotic arm (not shown). It is to be noted that delivery of the wafer W to the cylinders 25 is aided by the cylinders being in the raised position since the tips 27 of the cylinders are thereby above the plane of the slip-guard ring 17. Thus, it is easier for the robotic arm to deliver the wafer W to the cylinders. After delivery of the wafer, the cylinders 25 will move to a lower position due to the weight of the wafer W. The flow rate may thereafter be changed to place the wafer W in the processing position (FIG. 1) in which the wafer is generally co-planar with the ring 17. The machine 13 is thereafter operated to thermally process the wafer W. After the thermal process is complete, the flow rate is increased to raise the cylinders 25 to the raised position shown in FIG. 6, and the wafer W is removed by the robotic arm.

During thermal processing, each cylinder 25 is movable up or down as the wafer W deforms. If the wafer deforms downward against one of the cylinders 25, the cylinder moves downwardly and continues to exert substantially the same upwardly biasing force. The force is substantially the same since the gas is allowed to escape the bore 35 and since the flow rate and pressure is substantially identical among the cylinders 25. Likewise, if the wafer W deforms upward away from one of the cylinders, the cylinder moves upward due to the upwardly biasing force to remain in contact with the wafer to ensure that the wafer is positively supported. Since the weight of the wafer W is supported by a relatively large number of rests 21, and since the cylinders 25 are movable vertically, damage due to the rests is inhibited. Since the upwardly biasing force is generally equal on all the cylinders 25, the weight of the wafer W is generally equally distributed among the cylinders regardless of deformation of the wafer. Note that the described method is applicable to the other embodiments of the rests described above.

It is contemplated that the ducts could be modified such that the flow rate to each rest is separately controllable and thus be variable among the cylinders. In this manner, one could separately control the height of each cylinder and thereby re-position the wafer.

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. The combination of a semiconductor wafer and a holder for holding the semiconductor wafer for treatment in wafer treating apparatus, said holder comprising a plurality of supports for generally point support of the wafer at a plurality of points on the wafer, each support bearing a fraction of weight of the wafer and made of material capable of withstanding high temperatures, each support being movable up and down on a fixed lower member and subject to force biasing it to move upward, the total of the forces exerted on the supports biasing them upward being adapted to counterbalance the weight of the wafer.

2. A holder as set forth in claim 1 wherein each support is resiliently yieldable downwardly against the respective upwardly biasing force.

3. A holder as set forth in claim 1 wherein the upwardly biasing force on each support is established by a flow of pressurized gas.

4. A method of operating the holder set forth in claim 1 to raise or lower the wafer resting thereon comprising increasing or decreasing the biasing force on each support.

5. A method of operating the holder set forth in claim 1 comprising raising the supports to facilitate delivery of the wafer to the holder and to facilitate removal of the wafer from the holder.

6. A holder as set forth in claim 1 wherein the supports are made of quartz.

7. A holder as set forth in claim 1 wherein the supports are arranged such that there is open space between adjacent supports.

8. A holder for holding a semiconductor wafer for treatment in a wafer treating apparatus, said holder comprising:
a plurality of wafer rests for the resting of the wafer thereon, each rest being extensible up and down and comprising:
a lower elongate member fixed in generally vertically extending position, and
a generally vertically extending cylinder constituting a wafer-holding pin including a lower end receiving the lower elongate member and slidable up and down relative to said lower members and an upper closed end having a tapered tip for generally point engagement with a bottom surface of the wafer,
the cylinders providing at their upper ends for generally point support of the wafer at a plurality of points distributed around the bottom of the wafer, each cylinder bearing a fraction of the weight of the wafer, and a system for flow of gas under pressure into and out of each cylinder for establishing an upwardly biasing force on each cylinder,
the total of the forces exerted on the cylinder biasing them upward being adapted to counterbalance the weight of the wafer.

9. A holder as set forth in claim 8 wherein the rests are made of material capable of withstanding high temperatures.

10. A holder as set forth in claim 9 wherein the supports are arranged such that there is open space between adjacent supports.

11. A holder as set forth in claim 10 wherein the rests are made of quartz.

12. A holder as set forth in claim 8 wherein said gas flow system comprises the lower elongate members of the wafer rests, each lower elongate member comprising a tubular member extending into the respective cylinder through the lower end of the cylinder, the cylinder being thereby guided for its said up and down movement, said tubular member being adapted to deliver gas under pressure therethrough.

13. A method of operating the holder set forth in claim 12 to raise or lower the wafer resting on said upper members comprising increasing or decreasing the flow of gas to increase or decrease the force on said upper members.

14. A holder as set forth in claim 8 wherein said gas flow system includes, as to each wafer rest, an outlet for flow of gas out of the respective cylinder at the lower end of the cylinder so that the gas exits in a direction opposite the upper end of each cylinder.

15. A holder as set forth in claim 14 wherein the outlet is a passage between the cylinder and the tubular member.

16. A method of operating the holder set forth in claim 14 to raise or lower the wafer resting on the pins comprising increasing or decreasing the flow of gas to increase or decrease the upward force on said cylinders.

17. A holder as set forth in claim 8 wherein said gas flow system comprises the lower elongate members of the wafer rests, each lower elongate member comprising a tubular member extending into the respective cylinder through the lower end of the cylinder, the cylinder being thereby guided for its said up and down movement, gas under pressure being delivered through said tubular member; and
wherein said gas flow system includes, as to each wafer rest, an outlet for flow of gas out of the respective cylinder at the lower end of the cylinder.

18. A holder for holding a semiconductor wafer for treatment in wafer treating apparatus, said holder comprising:
a plurality of wafer rests for resting a wafer thereon, each rest being extensible up and down and comprising:
an upper member having an upper end for resting thereon of the wafer, each upper member being movable up and down on a fixed lower member,
said upper members of said rests providing at their upper ends for generally point support of the wafer at a plurality of points,
each upper member bearing a fraction of weight of the wafer, and being subject to force biasing it to move upward relative to the fixed lower member, the total of the forces exerted on the upper members biasing them upward being adapted to counterbalance the weight of the wafer,
the rests being spaced apart and the space between adjacent rests being open.

19. A holder as set forth in claim 18 wherein the rests are made of material capable of withstanding high temperatures.

20. A holder as set forth in claim 18 wherein the rests are made of quartz.

21. A holder as set forth in claim 18 wherein each upper member is constituted by a wafer-holding pin having a pointed upper end for the point support of the wafer at said plurality of points distributed on a bottom surface of the wafer.

22. A holder as set forth in claim 21 wherein each pin is resiliently yieldable downwardly against the respective upwardly biasing force.

23. A holder as set forth in claim 22 wherein the upwardly biasing force on each of the pins is established by flow of gas under pressure between each pin and the respective lower member on which the pin is movable up and down.

24. A holder as set forth in claims 18 wherein as to each of the rests one of said members has a rigid cavity therein and the upwardly biasing force on each of the upper members is provided by flow of gas under pressure into and out of the cavity.

25. A holder as set forth in claims 24 wherein the gas exits each rest in a direction generally opposite the upper end of the rest.

26. A method of operating the holder set forth in claim 18 to raise or lower the wafer resting on said upper members comprising increasing or decreasing the force on said upper members.

* * * * *